United States Patent
Walter

(10) Patent No.: US 10,920,322 B2
(45) Date of Patent: Feb. 16, 2021

(54) METHOD FOR DIRECTLY DEPOSITING PALLADIUM ONTO A NON-ACTIVATED SURFACE OF A GALLIUM NITRIDE SEMICONDUCTOR

(71) Applicant: Atotech Deutschland GmbH, Berlin (DE)

(72) Inventor: Andreas Walter, Berlin (DE)

(73) Assignee: Atotech Deutschland GmbH, Berlin (DE)

(*) Notice: Subject to any disclaimer, the term of this patent is extended or adjusted under 35 U.S.C. 154(b) by 0 days.

(21) Appl. No.: 16/320,123

(22) PCT Filed: Aug. 21, 2017

(86) PCT No.: PCT/EP2017/071003
§ 371 (c)(1),
(2) Date: Jan. 24, 2019

(87) PCT Pub. No.: WO2018/036951
PCT Pub. Date: Mar. 1, 2018

(65) Prior Publication Data
US 2019/0242017 A1    Aug. 8, 2019

(30) Foreign Application Priority Data
Aug. 23, 2016  (EP) ..................................... 16185352

(51) Int. Cl.
| C23C 18/44 | (2006.01) |
| C23C 18/16 | (2006.01) |
| H01L 33/00 | (2010.01) |
| H01L 33/32 | (2010.01) |

(52) U.S. Cl.
CPC .......... C23C 18/44 (2013.01); C23C 18/1642 (2013.01); H01L 33/007 (2013.01); H01L 33/32 (2013.01); H01L 33/325 (2013.01)

(58) Field of Classification Search
CPC ........................... C23C 18/44; C23C 18/1642
USPC ... 427/97.9, 99.5, 304, 305, 306, 437, 443.1
See application file for complete search history.

(56) References Cited

U.S. PATENT DOCUMENTS

| 4,424,241 | A | 1/1984 | Abys | |
| 8,003,532 | B2* | 8/2011 | Hua | H01L 21/76898 257/E21.585 |
| 2002/0179913 | A1* | 12/2002 | Shirakawa | H01L 21/8252 257/79 |
| 2006/0091430 | A1* | 5/2006 | Sriram | H01L 29/4175 257/280 |
| 2011/0200842 | A1* | 8/2011 | Uhlig | C23C 18/1601 428/652 |
| 2013/0034959 | A1* | 2/2013 | Chen | C23C 18/1619 438/678 |
| 2015/0249195 | A1* | 9/2015 | Han | C23C 18/48 257/98 |
| 2015/0287898 | A1 | 10/2015 | Walter | |

FOREIGN PATENT DOCUMENTS

| CN | 102169930 | 8/2011 |
| JP | 2004103975 A | 4/2004 |
| WO | WO-2014086567 A2 * | 6/2014 |

OTHER PUBLICATIONS

C.C. Huang et al: "Characteristics of a Pd/AlGaN/GaN Transistor Processed Using the Sensitization, Activation, and Electroless Plating ( EP) Approaches", Journal of the Electrochemical Society, vol. 159, No. 11, Aug. 31, 2012, pp. D637-D641.
PCT/EP2017/071003; PCT International Search Report and Written Opinion of the International Searching Authority dated Oct. 25, 2017.
Office Action for corresponding Japanese Application No. 2019-510919 dated Mar. 2, 2020.
Office Action for corresponding European Application No. 17755493.8 dated Aug. 11, 2020.

* cited by examiner

*Primary Examiner* — Dah-Wei D. Yuan
*Assistant Examiner* — Nga Leung V Law
(74) *Attorney, Agent, or Firm* — Renner, Otto, Boisselle & Sklar, LLP

(57) ABSTRACT

The present invention relates to a method for directly depositing palladium onto a non-activated surface of a gallium nitride semiconductor, the use of an acidic palladium plating bath (as defined below) for directly depositing metallic palladium or a palladium alloy onto a non-activated surface of a doped or non-doped gallium nitride semiconductor, and a palladium or palladium alloy coated, doped or non-doped gallium nitride semiconductor.

16 Claims, No Drawings

METHOD FOR DIRECTLY DEPOSITING PALLADIUM ONTO A NON-ACTIVATED SURFACE OF A GALLIUM NITRIDE SEMICONDUCTOR

The present application is a U.S. National Stage Application based on and claiming benefit and priority under 35 U.S.C. § 371 of International Application No. PCT/EP2017/071003, filed 21 Aug. 2017, which in turn claims benefit of and priority to European Application No. 16185352.8 filed 23 Aug. 2016, the entirety of both of which is hereby incorporated herein by reference.

TECHNICAL FIELD

The present invention relates to a method for directly depositing palladium onto a non-activated surface of a gallium nitride semiconductor, the use of an acidic palladium plating bath (as defined below) for directly depositing metallic palladium or a palladium alloy onto a non-activated surface of a doped or non-doped gallium nitride semiconductor, and a palladium or palladium alloy coated, doped or non-doped gallium nitride semiconductor.

BACKGROUND

Gallium nitride (GaN) is a widely known and used semiconductor material for manufacturing electronic elements such as light emitting diodes (LEDs), laser diodes (LDs), Schottky diodes, and High Electron Mobility Transistors (HEMTs).

GaN has several inherent advantages such as a large direct bandgap (3.4 eV) and high thermal stability providing several benefits for aforementioned electronic elements.

All these electronic elements require high quality metal contacts, i.e. a (noble) metal layer or a metal layer stack (typically containing a final noble metal layer) on the surface of the semiconductor with adequate adhesion and uniform distribution. As a very first contact metal layer towards the semiconductor surface usually palladium is deposited. Usually, a noble metal layer (e.g. gold) forms the final metal layer before soldering and bonding is carried out. Between the very first palladium layer and the final metal layer other metal layers are typically used, for example a nickel layer.

Very often, the first palladium metal layer is deposited by means of sputtering and vapor deposition or other physicochemical methods. However such methods often suffer the disadvantage that the entire surface is unspecifically or fully deposited such that a subsequent patterning is required in order to remove undesired deposited palladium. Furthermore, such methods are complex, sophisticated and energy consuming.

More recently, palladium deposition by using wet chemical electroless metal deposition was discussed by using an electroless palladium plating bath. This method includes low costs, easy operation, and no considerable energy consumption during the depositing process.

However, electroless metal deposition suffers the disadvantage of inadequately high surface roughness and comparatively long deposition time. Furthermore, it is extraordinary challenging to deposit a metal, in particular palladium, directly onto the semiconductor surface, i.e. without an additional activation or sensitization of the surface prior to electrolessly depositing palladium. By means of such activation, metal seeds are usually deposited on the semiconductor surface to initiate and promote the subsequent electroless deposition of for example palladium.

Typically, tin or aluminum metal seeds are deposited. In the absence of such activation, usually no palladium is deposited onto the semiconductor surface. This is in particular true for semiconductors made of gallium nitride.

In the article "Characteristics of a Pd/AlGaN/GaN Transistor Processed Using the Sensitization, Activation, and Electroless Plating (EP) Approaches", Huang, et al., Journal of the Electrochemical Society, 159, D637, 2012, a method for depositing palladium onto a gallium nitride surface is disclosed. For this purpose, an activation step utilizing colloidal tin is applied in order to subsequently deposit palladium.

In the article "Electroless nickel/gold ohmic contacts to p-type GaN", Lewis et al., Applied Physics Letters, 92, 062113, 2008, sensitization of a p-type GaN semiconductor is disclosed by contacting it with a $SnCl_2$ solution for 10 minutes at 40° C. Subsequently, it is contacted with a $PdCl_2$ solution for 20 minutes at 65° C.

U.S. Pat. No. 4,424,241 discloses a "process for electrolessly plating palladium on a catalytically active surface [i.e. activated surface] comprising the step of wetting said surface with an electroless palladium plating bath comprising reducing agent characterized in that the electroless palladium plating bath comprises a. source of palladium in the concentration range from 0.001 to 1.0 molar; b. sufficient acid so that the pH of the bath is less than 2, and; c. reducing agent consisting essentially of at least one compound selected from the group consisting of formaldehyde, formic acid, hypophosphoric acid and trimethoxyborohydride, said reducing agent present in the concentration range from 0.001 to 2.0 molar". Preferably, an organic additive is additionally included in the plating bath, preferably being saccharin. Plating is also obtained on semiconductor surfaces such as gallium arsenide.

In US 2015/0249195 A1 a method for forming a metal particle layer is disclosed, comprising bringing a base into contact with an activation solution comprising a metal compound, wherein the base is oxidized to produce electrons and the metal compound is reduced by the electrons to deposit metal particles on the surface of the base. The base comprises for example indium gallium zinc oxide, indium gallium tin oxide, and/or gallium zinc oxide. The metal compound comprises for example metal hydrates including palladium.

WO 2014/086567 A2 discloses a method for manufacture of wire bondable and/or solderable surfaces on noble metal electrodes. Furthermore, an aqueous plating bath for electroless deposition containing a source of palladium and saccharin is disclosed. The temperature of the plating bath is in the range of from 60 to 90° C.

There is an ongoing demand to overcome the disadvantages mentioned at the beginning and to provide an improved electroless palladium deposition method for semiconductors such as gallium nitride.

SUMMARY

It was the object of the present invention to provide an improved method for electroless palladium deposition onto a gallium nitride semiconductor, which
- directly deposits palladium onto a non-activated surface of the semiconductor, i.e. without an additional activation of the non-activated surface prior to the electroless deposition,
- is fast and reliable,
- provides adequate surface roughness, and
- at the same time allows a selective deposition of palladium on gallium nitride.

The above mentioned objective is solved by a method for directly depositing palladium onto a non-activated surface of a gallium nitride semiconductor, comprising in this order the steps:
(i) providing a doped or non-doped gallium nitride semiconductor with a non-activated surface,
(ii) providing an aqueous, acidic palladium plating bath, comprising (a) $Pd^{2+}$ ions,
(b) one or more than one reducing agent suitable to reduce $Pd^{2+}$ ions to metallic $Pd^0$,
(c) one or more than one compound selected from the group consisting of compounds of formulae (I) and (II)

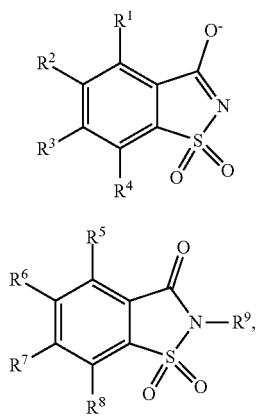

wherein $R^1$, $R^2$, $R^3$, $R^4$, $R^5$, $R^6$, $R^7$, and $R^8$ are independently H, alkyl, aryl, hetero aryl, $NH_2$, $SO_3H$, or OH, and
$R^9$ is independently H, alkyl, aryl, or hetero aryl,
(iii) contacting the semiconductor with the plating bath such that metallic palladium or a palladium alloy is electrolessly deposited onto the non-activated surface of the semiconductor, the plating bath temperature being in the range of from 70° C. to 99° C.

DETAILED DESCRIPTION

Throughout the text, the term "electrolessly" denotes the adverb of electroless.

In step (i) of the method of the present invention a gallium nitride semiconductor with a non-activated surface is provided. This basically means that this surface by itself does not reduce $Pd^{2+}$ ions to metallic $Pd^0$ or mediates the reduction of $Pd^{2+}$ ions to metallic $Pd^0$.

As mentioned above in the text, an activation (also often called sensitization) is usually applied in the art. Typically, such a step includes adsorption of activation metals such as tin ions or colloidal tin on the non-activated surface. In case of $Sn^{2+}$ ions, these ions are oxidized on the gallium nitride surface to $Sn^{4+}$ ions in the presence of $Pd^{2+}$ ions, which are in turn reduced to metallic palladium. Such a redox reaction acts as the initial catalyst for depositing palladium.

According to our own experiments, the method of the present invention does not require such an additional activation/sensitization. The method rather allows to directly deposit metallic palladium or a palladium alloy onto the non-activated surface of the gallium nitride semiconductor.

As a result, a method according to the present invention (as described above) is preferred, wherein the surface of the semiconductor (i.e. the non-activated surface) is not contacted with or does not comprise $Sn^{2+}$ ions prior to step (iii) or when step (iii) is carried out, preferably is not contacted with or does not comprise tin ions or tin atoms prior to step (iii) or when step (iii) is carried out, more preferably is not contacted with or does not comprise activation metal ions or activation metal atoms prior to step (iii) or when step (iii) is carried out. This means that the surface of the semiconductor is not contacted with $Sn^{2+}$ ions prior to step (iii) or when step (iii) is carried out, preferably is not contacted with tin ions or tin atoms prior to step (iii) or when step (iii) is carried out, more preferably is not contacted with activation metal ions or activation metal atoms prior to step (iii) or when step (iii) is carried out. It also means that the surface of the semiconductor does not comprise adsorbed $Sn^{2+}$ ions prior to step (iii) or when step (iii) is carried out, preferably does not comprise adsorbed tin ions or tin atoms prior to step (iii) or when step (iii) is carried out, more preferably does not comprise adsorbed activation metal ions or activation metal atoms prior to step (iii) or when step (iii) is carried out.

Activation metals (in a free, bound, complexed, or colloidal form—either as atoms or ions) are typically selected from the group consisting of tin, platinum, and aluminium, preferably selected from the group consisting of tin and aluminium. Furthermore it is preferred that prior to step (iii) the surface of the semiconductor is not contacted with or does not comprise palladium, e.g. as activation metal (in a free, bound, complexed, or colloidal form—either as atoms or ions, in particular is not contacted with or does not comprise colloidal palladium).

A different approach in the art to activate a surface of a semiconductor, in particular a surface containing gallium, is to rinse the surface with a composition (e.g. an aqueous solution) containing one or more than one reducing agent suitable to reduce $Pd^{2+}$ ions to metallic $Pd^0$ (prior to a subsequent palladium deposition) in order to deposit an excess of reducing agent on the surface in order to accelerate the start of a metal deposition reaction. Typically, organic reducing agents are utilized, more typically the one or more than one reducing agent is selected from the group consisting of glyoxylic acid and salts thereof, hydrazine, hydroxylamine, formic acid and salts thereof, formaldehyde, trimethylamine borane, trimethoxyborohydrides, hypophosphorous acid (also called phosphinic acid) and salts thereof (i.e. hypophosphites, respectively phosphinates), phosphorous acid and salts thereof (i.e. phosphites), and hypophosphoric acid and salts thereof (i.e. hypophosphates). According to our own experiments such activation is not needed for the method of the present invention. Thus, a method according to the present invention (as described above, preferably as described as being preferred) is preferred, wherein the surface of the semiconductor is not contacted with one or more than one organic reducing agent suitable to reduce $Pd^{2+}$ ions to metallic $Pd^0$ prior to step (iii), preferably is not contacted with one or more than one organic reducing agent selected from the group consisting of glyoxylic acid and salts thereof, hydrazine, hydroxylamine, formic acid and salts thereof, formaldehyde, trimethylamine borane, trimethoxyborohydrides, hypophosphorous acid (also called phosphinic acid) and salts thereof (i.e. hypophosphites, respectively phosphinates), phosphorous acid and salts thereof (i.e. phosphites), and hypophosphoric acid and salts thereof (i.e. hypophosphates) prior to step (iii). Most preferably, the surface of the gallium nitride semiconductor is neither contacted with an activation metal (preferably as defined above) prior to step (iii) nor with a reducing agent (preferably as defined above) prior to step (iii).

Preferred is a method according to the present invention (as described above, preferably as described as being preferred), wherein the surface of the semiconductor is not contacted with one or more than one reducing agent suitable to reduce $Pd^{2+}$ ions to metallic $Pd^0$ prior to step (iii), preferably is not contacted with one or more than one reducing agent selected from the group consisting of glyoxylic acid and salts thereof, hydrazine, hydroxylamine, formic acid and salts thereof, formaldehyde, trimethylamine borane, trimethoxyborohydrides, hypophosphorous acid (also called phosphinic acid) and salts thereof (i.e. hypophosphites, respectively phosphinates), phosphorous acid and salts thereof (i.e. phosphites), and hypophosphoric acid and salts thereof (i.e. hypophosphates) prior to step (iii).

More preferred is a method according to the present invention (as described above, preferably as described as being preferred), wherein the surface of the semiconductor is not contacted with or does not comprise $Sn^{2+}$ ions prior to step (iii) or when step (iii) is carried out, preferably is not contacted with or does not comprise tin ions or tin atoms prior to step (iii) or when step (iii) is carried out, more preferably is not contacted with or does not comprise activation metal ions or activation metal atoms prior to step (iii) or when step (iii) is carried out, and the surface of the semiconductor is not contacted with one or more than one reducing agent suitable to reduce $Pd^{2+}$ ions to metallic $Pd^0$ prior to step (iii), preferably is not contacted with one or more than one reducing agent selected from the group consisting of glyoxylic acid and salts thereof, hydrazine, hydroxylamine, formic acid and salts thereof, formaldehyde, trimethylamine borane, trimethoxyborohydrides, hypophosphorous acid (also called phosphinic acid) and salts thereof (i.e. hypophosphites, respectively phosphinates), phosphorous acid and salts thereof (i.e. phosphites), and hypophosphoric acid and salts thereof (i.e. hypophosphates) prior to step (iii).

Most preferred is a method according to the present invention (as described above, preferably as described as being preferred), wherein the surface of the semiconductor is not contacted with or does not comprise activation metal ions or activation metal atoms prior to step (iii) or when step (iii) is carried out, and the surface of the semiconductor is not contacted with one or more than one reducing agent suitable to reduce $Pd^{2+}$ ions to metallic $Pd^0$ prior to step (iii).

Preferably, in the method of the present invention (as described above, preferably as described as being preferred) the doped or non-doped gallium nitride semiconductor provided in step (i) contains only non-activated surfaces.

It is preferred that in the method of the present invention (as described above, preferably as described as being preferred) only a cleaning step or a series of cleaning steps prior to step (iii) is carried out. Such a cleaning step is not an activation step. This preferably means that the ingredients of a respective cleaning solution are selected in such a way that they do not exhibit activating capacities. Only in case such an ingredient basically exhibits activating capacities, it is contained in an amount insufficient to activate the semiconductor surface, preferably such ingredients are not contained in a respective cleaning solution.

Thus, a method according to the present invention (as described above, preferably as described as being preferred) is preferred comprising the additional step prior to step (iii)

cleaning the non-activated surface with a cleaning solution, the cleaning solution preferably comprising one or more than one ingredient selected from the group consisting of acids, bases, oxidizing agents, halogen ions, and organic solvents.

Preferred acids are HCl, HF, $H_2SO_4$. A preferred base is ammonia. A preferred oxidizing agent is $H_2O_2$. Preferred halogen ions are chloride and fluoride ions. Preferred organic solvents are alcohols, preferably short chain alcohols, and acetone.

A preferred cleaning solution is selected from the group consisting of HCl, HF, a mixture of sulphuric acid and $H_2O_2$, a mixture of ammonia and $H_2O_2$, and acetone. Preferably, all aforementioned preferred cleaning solutions are diluted with water.

Such a cleaning step is preferred in order to remove organic residues and/or oxidized gallium from the surface of the semiconductor.

Preferably, after the cleaning the semiconductor surface is rinsed with deionized water. This usually quantitatively removes even traces of the cleaning solution.

As mentioned before, the cleaning solution in the method of the present invention does not impart activation properties to the semiconductor surface. Thus, after the cleaning step a doped or non-doped gallium nitride semiconductor with a non-activated, cleansed surface is provided.

In step (i) of the method of the present invention a doped or non-doped gallium nitride semiconductor is provided. A non-doped gallium nitride semiconductor preferably consists of gallium nitride. A doped gallium nitride semiconductor comprises additionally foreign atoms in an amount/number in the range of from $10^{17}$ to $10^{21}$ per $cm^{-3}$ gallium nitride semiconductor. Such a doping usually increases the electrical conductivity.

There are basically two kinds of doping, n-doping and p-doping; n-doping means insertion of donating atoms (donators), thereby increasing negative charge density, p-doping means insertion of accepting atoms (acceptors), thereby increasing positive charge density.

A method according to the present invention (as described above, preferably as described as being preferred) is preferred, wherein the doped gallium nitride semiconductor is doped with atoms selected from the group consisting of aluminium, indium, silicon, magnesium, germanium, carbon, selenium, oxygen, beryllium, zinc, and mixtures thereof. These atoms are incorporated/embedded into the gallium nitride and not only contacted with or adsorbed at the semiconductor surface. In this way, aluminium as dopant for example is clearly distinct from aluminium as activation metal. This likewise applies to metal atoms potentially useable as dopant and activation metal.

Such additional atoms in the gallium nitride semiconductor have various advantages. For example, aluminium shifts the wave length of emitted light in LEDs to a wavelength for blue light, silicon increases electron conductivity, wherein magnesium decreases electron conductivity. Indium for example has an effect on crystal growth and potentially reduces inner tensions in the gallium nitride lattice.

Preferably, the doped gallium nitride semiconductor is doped with one or more than one kind of metal, more preferably the doped gallium nitride semiconductor is doped with atoms selected from the group consisting of aluminium, indium, magnesium, germanium, selenium, beryllium, zinc, and mixtures thereof.

A method of the present invention (as described above, preferably as described as being preferred) is preferred, wherein the doped or non-doped gallium nitride semiconductor does not contain arsenic, respectively, is not doped with arsenic. Thus, the semiconductor does preferably not contain arsenic in any form, neither for doping nor as an ingredient usually in an amount above for dopants. This also means that the semiconductor is preferably not a gallium arsenide semiconductor.

Typically, a semiconductor (such as the gallium nitride semiconductor in the method of the present invention) is mounted onto a substrate for structural reinforcement. Preferably, the gallium nitride semiconductor has a thickness in the range of from 100 nm to 10 μm. Therefore, a method of the present invention (as described above, preferably as described as being preferred) is preferred, wherein the doped or non-doped gallium nitride semiconductor is mounted onto a substrate, preferably a substrate comprising one or more than one of $Al_2O_3$, SiC, and Si, more preferably a substrate selected from the group consisting of $Al_2O_3$, SiC, and Si, most preferably the substrate is Si. A typical and preferred substrate comprising/consisting of Si is a silicon waver.

In step (ii) of the method of the present invention an aqueous, acidic palladium plating bath is provided.

A method of the present invention (as described above, preferably as described as being preferred) is preferred, wherein the pH of the acidic palladium plating bath is in the range of from 4.0 to 6.5, preferably from 5.3 to 6.3.

A too low pH is less preferred. It is assumed that, if the pH is too low, for example considerably below 2, insufficiently stable palladium complexes are formed or the formation of palladium complexes is even fully prevented (for complexing agents see the text below). According to our own experiments, an undesired plate out was observed in some cases. In contrast, if the pH is alkaline palladium hydroxide is formed, which easily precipitates and induces undesired palladium skip plating. These effects are to be avoided.

Our own experiments have shown that an acidic pH is essential for the direct deposition of palladium onto the non-activated surface of the gallium nitride semiconductor. However, optimal results have been observed with a pH in the range of from 4.0 to 6.5; excellent results with a pH in the range of from 5.3 to 6.3.

Furthermore, the plating bath contains palladium ions ($Pd^{2+}$ ions). A method of the present invention (as described above, preferably as described as being preferred) is preferred, wherein the total amount of $Pd^{2+}$ ions in the palladium plating bath is in the range of from 0.5 mmol/L to 500 mmol/L, based on the total volume of the palladium plating bath, preferably is in the range of from 0.5 mmol/L to 100 mmol/L, more preferably is in the range of from 0.6 mmol/L to 20 mmol/L.

Our own experiments have shown that undesired plate out and excessive palladium plating, respectively, is observed if the total amount of palladium in the palladium plating bath considerably exceeds 500 mmol/L. If the total amount is considerably below 0.5 mmol/L no sufficient palladium deposition is achieved in a reasonable time, which means that the deposition rate is too low. Furthermore, undesired palladium skip plating occurred in several cases.

The palladium ions in the aqueous, acidic palladium plating bath are typically provided from a palladium ion source, such as an inorganic and/or organic palladium salt. Preferably, the palladium ion source does not comprise palladium nitrate. More preferably the aqueous, acidic palladium plating bath comprises nitrate ions in a total amount of 0 to 0.1 mmol/L, based on the total volume of the plating bath, most preferably the aqueous, acidic palladium plating bath does not comprise nitrate ions at all. Our own experiments have shown that nitrate in comparatively high amounts unacceptably decreases the palladium deposition rate. Furthermore, nitrate salts usually contain very low amounts of nitrite. It is assumed that those very low amounts of nitrite severely decrease the palladium deposition rate.

A method of the present invention (as described above, preferably as described as being preferred) is preferred, wherein the $Pd^{2+}$ ions in the palladium plating bath are from one or more than one palladium ion source selected from the group consisting of palladium chloride, palladium bromide, palladium acetate, and palladium sulphate. Preferably only one palladium ion source is used. The above mentioned palladium ions are usually well available and cost efficient. Most preferably, the $Pd^{2+}$ ions in the palladium plating bath are from palladium sulphate. Palladium nitrate is not preferred, preferably the palladium ion source does not comprise palladium nitrate.

The aqueous, acidic palladium plating bath furthermore contains one or more than one reducing agent suitable to reduce $Pd^{2+}$ ions to metallic $Pd^0$ (i.e. one or more than one reducing agent for reducing $Pd^{2+}$ ions to metallic $Pd^0$ in an acidic, aqueous environment and at temperatures of 70° C. and above). A method of the present invention (as described above, preferably as described as being preferred) is preferred, wherein (in case of more than one reducing agent) at least one reducing agent is selected from the group consisting of glyoxylic acid and salts/esters thereof, hydrazine, hydroxylamine, formic acid and salts/esters thereof, formaldehyde, trimethylamine borane, trimethoxyborohydrides, hypophosphorous acid (also called phosphinic acid) and salts/esters thereof (i.e. hypophosphites, respectively phosphinates), phosphorous acid and salts/esters thereof (i.e. phosphites), and hypophosphoric acid and salts/esters thereof (i.e. hypophosphates), preferably at least comprises formic acid and/or salts/esters thereof.

More preferred is a method of the present invention (as described above, preferably as described as being preferred), wherein the one or more than one reducing agent is selected from the group consisting of glyoxylic acid and salts/esters thereof, hydrazine, hydroxylamine, formic acid and salts/esters thereof, formaldehyde, trimethylamine borane, trimethoxyborohydrides, hypophosphorous acid (also called phosphinic acid) and salts/esters thereof (i.e. hypophosphites, respectively phosphinates), phosphorous acid and salts/esters thereof (i.e. phosphites), and hypophosphoric acid and salts/esters thereof (i.e. hypophosphates), preferably selected from the group consisting of glyoxylic acid and salts/esters thereof, hydrazine, hydroxylamine, formic acid and salts/esters thereof, and formaldehyde, most preferred the reducing agent is formic acid and/or salts/esters thereof.

Although esters of the aforementioned acids are included in the method of the present invention, they are less preferred. Preferably, the acids among the aforementioned reducing agents preferably only include acids and salts thereof (without esters).

According to our own experiments, an optimal palladium deposition rate and quality was achieved using a formic acid salt such as sodium formate, which is in particular preferred as reducing agent in the palladium plating bath.

If the one or more than one reducing agent is selected from the group consisting of glyoxylic acid and salts/esters thereof, hydrazine, hydroxylamine, formic acid and salts thereof, and formaldehyde pure palladium is deposited onto the semiconductor. In case one or more than one reducing agent contains boron or phosphorous a respective palladium alloy is obtained. Preferably pure palladium is deposited onto the semiconductor. This is even useful if another metal alloy layer is to be deposited onto the semiconductor. In such a case, first a thin pure palladium layer is deposited, which acts as seed layer for a subsequent metal alloy layer. The term "pure palladium" denotes that preferably no other metals are included in the palladium deposit. However, an electroless deposition of palladium in the presence of a reducing agent usually results in a minor co-deposition of organic compounds such as the reducing agent. Thus, in a pure palladium deposit as obtained with the method of the present invention typically a small amount of carbon is found, usually up to one weight percent, based on the total weight of the deposit. Nevertheless, such a palladium deposit is usually considered as a pure palladium deposit.

A method of the present invention (as described above, preferably as described as being preferred) is preferred, wherein the total amount of the one or more than one reducing agent in the palladium plating bath is in the range of from 0.1 mmol/L to 100 mmol/L, based on the total volume of the palladium plating bath, preferably is in the range of from 5 mmol/L to 80 mmol/L, more preferably is in the range of from 10 mmol/L to 70 mmol/L.

If the total amount of reducing agent considerably exceeds 100 mmol/L an undesired plate out of palladium in the plating bath was observed in some cases. Furthermore, in some instances an undesired amount of reducing agent was incorporated into the palladium deposit. If the total amount is considerably below 0.1 mmol/L no sufficient deposition is achieved in a reasonable time although a partial deposition was observed.

Preferably, the total amount of reducing agent selected from the group consisting of glyoxylic acid and salts/esters thereof, hydrazine, hydroxylamine, formic acid and salts thereof, formaldehyde, trimethylamine borane, trimethoxyborohydrides, hypophosphorous acid (also called phosphinic acid) and salts thereof (i.e. hypophosphites, respectively phosphinates), phosphorous acid and salts thereof (i.e. phosphites), and hypophosphoric acid and salts thereof (i.e. hypophosphates), is in the range of from 0.1 mmol/L to 100 mmol/L, based on the total volume of the palladium plating bath, preferably is in the range of from 5 mmol/L to 80 mmol/L, more preferably is in the range of from 10 mmol/L to 70 mmol/L; preferably with the proviso that no other reducing agents as mentioned in the aforementioned list of preferred reducing agents are included in the plating bath. More preferably, the total amount of reducing agent selected from the group consisting of glyoxylic acid and salts/esters thereof, hydrazine, hydroxylamine, formic acid and salts thereof and formaldehyde is in the range of from 0.1 mmol/L to 100 mmol/L, based on the total volume of the palladium plating bath, preferably is in the range of from 5 mmol/L to 80 mmol/L, more preferably is in the range of from 10 mmol/L to 70 mmol/L; preferably with the proviso that no other reducing agents as mentioned in the aforementioned list of more preferred reducing agents are included in the plating bath.

The aqueous, acidic palladium plating bath furthermore contains one or more than one compound selected from the group consisting of compounds of formulae (I) and (II) (as defined in the text above).

Our own experiments have shown that the presence of one or more of these compounds allows the direct deposition of palladium onto a non-activated surface of a gallium nitride semiconductor if the respective plating bath is acidic and has a plating bath temperature in the range of from 70° C. to 99° C. during the deposition process.

Compounds of formulae (I) and (II), respectively, are based on saccharin, salts and derivatives thereof. Referring to the compounds of formulae (I) and (II) the term "independently" is for example used in connection with moieties $R^1$, $R^2$, $R^3$, $R^4$, $R^5$, $R^6$, $R^7$, $R^8$, and $R^9$. This means that for example $R^1$ is independently selected from $R^2$, $R^3$, $R^4$, $R^5$, $R^6$, $R^7$, $R^8$, and $R^9$ in the same compound. The same applies to $R^2$ to $R^9$, respectively. The term also means that, in case of for example more than one compound of formulae (I), $R^1$ in a first compound of formula (I) is independently selected from a $R^1$ in a second compound of formula (I). Again, the same applies to $R^2$ to $R^9$ and compounds of formula (II), respectively.

A method of the present invention (as described above, preferably as described as being preferred) is preferred, wherein alkyl in $R^1$ to $R^9$ independently denotes methyl, ethyl, linear C3 to C6 alkyl, or branched C3 to C6 alkyl, more preferably alkyl in $R^1$ to $R^9$ independently denotes methyl, ethyl, n-propyl, iso-propyl, n-butyl, sec-butyl, tert-butyl, n-pentyl, sec-pentyl, iso-pentyl, neo-pentyl, n-hexyl, iso-hexyl, 3-methyl-pentyl, neo-hexyl, or 2,3-dimethylbutyl, even more preferably alkyl in $R^1$ to $R^9$ independently denotes methyl, ethyl, or iso-propyl. Of the aforementioned alkyl moieties methyl, ethyl and linear alkyl are in particular preferred, most preferred are methyl, ethyl and n-propyl. Our own experiments have shown that compounds of formulae (I) and (II) with such alkyl moieties exhibit a good solubility in the palladium plating bath.

A method of the present invention (as described above, preferably as described as being preferred) is preferred, wherein aryl in $R^1$ to $R^9$ independently denotes unsubstituted phenyl or substituted phenyl. Preferred substituents are independently selected from the group consisting of —$NH_2$, —$SO_3H$, and —OH. Our own experiments have shown that the solubility of compounds of formulae (I) and (II) containing one or more than one phenyl, each including one or more than one of the aforementioned substituents is increased compared to respective compounds containing phenyl not including one or more than one of the aforementioned substituents.

A method of the present invention (as described above, preferably as described as being preferred) is preferred, wherein hetero aryl in $R^1$ to $R^9$ independently denotes pyridine, imidazole, furane, thiazole, or thiophene, each individually substituted or unsubstituted. For preferred substituents of these hetero aryls see above for substituted phenyl. It is assumed, according to our own experiments, that in some cases hetero atoms in the hetero aryl significantly increase the adhesion/coordination strength of the compound onto the semiconductor surface compared to compounds not containing a hetero aryl.

A method of the present invention (as described above, preferably as described as being preferred) is preferred, wherein at least two out of $R^1$, $R^2$, $R^3$, $R^4$ and at least two out of $R^5$, $R^6$, $R^7$, and $R^8$ are independently H, preferably at least three out of $R^1$, $R^2$, $R^3$, $R^4$ and at least three out of $R^5$, $R^6$, $R^7$, and $R^8$ are independently H.

A method of the present invention (as described above, preferably as described as being preferred) is preferred, wherein R⁹ is independently H, methyl, ethyl, n-propyl, iso-propyl, n-butyl, sec-butyl or tert-butyl, preferably is H or methyl.

A method of the present invention (as described above, preferably as described as being preferred) is in particular preferred, wherein (c) is one or more than one compound of formula (I), preferably is a compound of formula (I), wherein $R^1$, $R^2$, $R^3$, and $R^4$ is H.

The compound of formula (I) is typically provided as a salt. Preferably, the counterion for the compound of formula (I) is independently selected from the group of cations consisting of ammonium, alkali metals, and alkaline earth metals, more preferably independently selected from the group of cations consisting of ammonium, sodium, and potassium, most preferably the counterion is sodium. Such salts typically exhibit a very good solubility in the plating bath.

The most preferred compound of (c) is a saccharin salt, preferably sodium saccharin, most preferably in a total amount as defined below.

A method of the present invention (as described above, preferably as described as being preferred) is preferred, wherein the total amount of (c) in the plating bath is in the range of from 0.05 mmol/L to 50 mmol/L, based on the total volume of the plating bath, preferably from 0.4 mmol/L to 20 mmol/L, more preferably from 1 mmol/L to 10 mmol/L. If the total amount of (c) in the plating bath is considerably below 0.05 mmol/L or considerably above 50 mmol/L an undesirable low palladium deposition rate is observed.

The aqueous, acidic palladium plating bath may comprise further constituents. Thus, a method of the present invention (as described above, preferably as described as being preferred) is preferred, wherein the palladium plating bath additionally contains (d) one or more than one complexing compound selected from the group consisting of amines,
  preferably selected from the group consisting of primary amines, and secondary amines,
  more preferably selected from the group consisting of ethylenediamine, 1,3-diaminopropane, 1,2-bis(3-aminopropylamino)ethane, 2-diethylaminoethylamine, diethylenetriamine, diethylenetriaminepentaacetic acid, nitroacetic acid, N-(2-hydroxyethyl)ethylenediamine, ethylenediamine-N,N-diacetic acid, 2-(dimethylamino)ethylamine, 1,2-diamino-propylamine, 1,3-diaminopropylamine, 3-(methylamino)-propylamine, 3-(dimethylamino)propylamine, 3-(diethyl-amino)propylamine, bis-(3-aminopropyl)amine, 1,2-bis-(3-aminopropyl)alkylamine, diethylenetriamine, triethylenetetramine, tetraethylenepentamine, and pentaethylenehexamine.

Preferably, the one or more than one complexing compound selected from the group consisting of amines does not include tertiary amines. Of the aforementioned amines primary amines are in particular preferred.

In most cases a method of the present invention (as described above, preferably as described as being preferred) is preferred, wherein the one or more than one complexing compound selected from the group consisting of amines is preferably an aliphatic amine, more preferably an aliphatic amine at least comprising one primary amine moiety (preferably specific amines as mentioned above), even more preferably an aliphatic amine comprising only primary amine moieties (preferably specific amines as mentioned above).

A complexing compound such as defined above stabilizes the palladium ions in the plating bath and prevents undesired reduction of $Pd^{2+}$ ions to metallic $Pd^0$ and its precipitation in the plating bath. Therefore, a method of the present invention (as described above, preferably as described as being preferred) is preferred, wherein the molar ratio of the total amount of the one or more than one complexing compound in the palladium plating bath to the total amount of palladium ions in the palladium plating bath, each based on the total volume of the palladium plating bath, is in the range of from 2:1 to 20:1.

Preferably, the total amount of complexing agent in the plating bath is in the range of from 1 mmol/L to 1000 mmol/L, preferably from 1.5 mmol/L to 200 mmol/L, preferably from 15 mmol/L to 85 mmol/L, based on the total volume of the plating bath.

In some cases a method of the present invention (as described above, preferably as described as being preferred) is preferred, wherein the plating bath specifically comprises
(e) one or more than one aliphatic aldehyde
and/or
(f) one or more than one unsubstituted or substituted phenol.

Our own experiments have shown that compounds of (e) and (f) in some cases accelerate the deposition rate of palladium in the method of the present invention.

Preferred aliphatic aldehydes (aliphatic compound at least comprising one aldehyde group) are selected from the group consisting of aliphatic C1 to C6 aldehydes, preferably aliphatic C1 to C3 aldehydes, more preferably the aliphatic aldehyde is formaldehyde and/or glyoxylic acid, most preferably the aliphatic aldehyde is glyoxylic acid. According to our own experiments glyoxylic acid (containing an aldehyde group and a carboxyl group) leads to very similar results compared to formaldehyde. However, glyoxylic acid is environmental friendly, less hazardous to health, and exhibits very good solubility in the palladium plating bath. Thus, glyoxylic acid is an excellent alternative for formaldehyde, also as reducing agent.

Formaldehyde and glyoxylic acid exhibit reducing properties and, thus, are reducing agents in the sense of the method of the present invention. Whenever one of the one or more than one aliphatic aldehyde is suitable to reduce $Pd^{2+}$ ions to metallic $Pd^0$, they form a subspecies of (b) in the palladium plating bath in the method of the present invention.

Preferred substituted phenols are selected from the group consisting of bisphenols, nitrophenols, hydroxyphenols, and hydroxy benzoic acids. More preferred substituted phenols are selected from the group consisting of bisphenol A, 4-cumylphenol, o-, m-, p-nitrophenol, resorcin, and salicylic acid.

In step (iii) of the method of the present invention the semiconductor is contacted with the plating bath such that metallic palladium or a palladium alloy is electrolessly deposited onto the non-activated surface of the semiconductor.

A method of the present invention (as described above, preferably as described as being preferred) is preferred, wherein in step (iii) the semiconductor and the plating bath are in contact (contact time) for 10 to 1200 seconds, preferably for 30 to 800 seconds, more preferably for 60 to 400 seconds.

If the contact time is considerably below 10 seconds no or only an insufficient deposition of palladium/palladium alloy is obtained. In many cases the layer thickness of deposited palladium/palladium alloy is too low.

On the contrary, if the contact time is considerably longer than 1200 seconds a palladium/palladium alloy layer thickness is obtained, which is usually too or unnecessarily high for most of the subsequent applications (for layer thickness and subsequent applications see text below).

During step (iii) the plating bath temperature is in the range of from 70° C. to 99° C. A method of the present invention (as described above, preferably as described as being preferred) is preferred, wherein the plating bath temperature in step (iii) is in the range of from 70° C. to 95° C., preferably in the range of from 75° C. to 95° C., more preferably in the range of from 79° C. to 91° C. The aforementioned plating bath temperatures are preferably determined at typical atmospheric pressure conditions, preferably at 101.325 kPa.

The above mentioned temperature in the range of from 70° C. to 99° C. is essential in order to directly deposit palladium onto the non-activated surface of the gallium nitride semiconductor. If the temperature is too low no palladium or palladium alloy is deposited (see examples below). If the temperature exceeds 99° C. the aqueous, acidic palladium plating bath starts heavily boiling, which is undesired. Preferably, the temperature is selected within the range of from 70° C. to 99° C. such that no disturbing convection is observed by means of gas emission in the plating bath.

According to our own experiments, a suitable layer thickness of palladium or palladium alloy for further treatment is obtained with the method of the present invention. A method of the present invention (as described above, preferably as described as being preferred) is preferred, wherein the deposited palladium and palladium alloy has a total layer thickness in the range of from 10 nm to 1000 nm, more preferably 50 nm to 400 nm, most preferably 100 nm to 300 nm. In some cases a method of the present invention is preferred, wherein pure palladium is deposited, preferably with a layer thickness in the range of from 10 nm to 1000 nm, more preferably 50 nm to 400 nm, most preferably 100 nm to 300 nm. In other cases a method of the present invention is preferred, wherein a palladium alloy is deposited, preferably with a layer thickness in the range of from 10 nm to 1000 nm, more preferably 50 nm to 400 nm, most preferably 100 nm to 300 nm.

A benefit of the method of the present invention is (in addition to the direct deposition) that palladium/palladium alloy can be selectively deposited on the surface of the gallium nitride semiconductor if a respective patterning is present prior to step (iii) in order to obtain a palladium or palladium alloy pattern after step (iii). Therefore, a method of the present invention (as described above, preferably as described as being preferred) is preferred, wherein the metallic palladium or palladium alloy is selectively deposited onto the non-activated surface such that a palladium pattern or palladium alloy pattern is obtained on the surface of the semiconductor. Thus, a method of the present invention (as described above, preferably as described as being preferred) is preferred, wherein the non-activated surface is patterned prior to step (iii), preferably by a mask. This means that in some cases a method of the present invention (as described above, preferably as described as being preferred) is preferred, wherein the non-activated surface is selectively covered (concealed) by a cover prior to step (iii), preferably a mask, such that the patterning prior to step (iii) results.

As mentioned above, the gallium nitride semiconductor is preferably mounted onto a substrate such as a silicon wafer. Generally, in order to obtain a patterned non-activated surface, the gallium nitride forming the semiconductor is (a) deposited onto the substrate by selective deposition or (b) deposited entirely onto the substrate surface and subsequently patterned by selective removal of gallium nitride or by covering gallium nitride areas by a cover, preferably a mask; areas which are not to be deposited by palladium/ palladium alloy.

According to our own experiments, the method of the present invention (as described above, preferably as described as being preferred) is specific for the deposition of metallic palladium or palladium alloy almost exclusively onto the gallium nitride semiconductor with the non-activated surface but not for the substrate or the cover/mask. This is a great advantage compared to e.g. colloidal activation metals used in the art, which usually adsorb onto the entire surface, including exposed gallium nitride, substrate and mask. Thus, the method of the present invention drastically reduces the amount of wasted palladium due to this selectivity. Therefore, a method of the present invention (as described above, preferably as described as being preferred) is preferred, wherein the electroless deposition of metallic palladium and palladium alloy is selective for gallium nitride.

The contacting according to step (iii) is preferably carried out by immersing (dipping) the semiconductor with its non-activated surface into the aqueous, acidic palladium plating bath, preferably in a batch method. Advantageously, a large number of semiconductors can be treated simultaneously, which is time and cost efficient. Afterwards, the treated semiconductor(s) is (are) preferably rinsed with deionized water, preferably for at least two minutes. Another advantage of the method of the present invention is that even more than one surface of a semiconductor can be treated simultaneously. For example, substrates mounted on both sides with a semiconductor or two-sided semiconductors exhibit more than one non-activated surface. Thus, in some cases a method of the present invention (as described above, preferably as described as being preferred) is preferred, wherein in step (iii) more than one non-activated surface is either fully or selectively contacted with the palladium plating bath at the same time. This dramatically reduces time and effort compared to conventional sputtering methods used in the art. As mentioned, at the same time a selective palladium deposition on gallium nitride is possible with the method of the present invention (the method as described above, preferably as described as being preferred).

The deposited metallic palladium/palladium alloy can serve as a seed layer for additional metal deposition steps. Thus, a method of the present invention (as described above, preferably as described as being preferred) is preferred comprising after step (iii) the additional step (iv) depositing an additional metal layer or metal alloy layer onto the electrolessly deposited metallic palladium/palladium alloy obtained after step (iii), preferably by electroless deposition.

Preferably, metals for the additional metal layer/metal alloy layer are selected from the group consisting of nickel, palladium, cobalt, copper, and gold. In some cases it is preferred that more than one additional metal layer/metal alloy layer is deposited onto the electrolessly deposited metallic palladium/palladium alloy obtained after step (iii), preferably by selecting the metals from the aforementioned list. As a result, a layer stack is obtained.

Various layer stacks are known in the art. For example, there are electroless nickel immersion gold (ENIG), electroless nickel electroless palladium (ENEP), electroless nickel electroless palladium immersion gold (ENEPIG), electroless palladium immersion gold (EPIG) and electroless palladium autocatalytic gold (EPAG) layer stacks. In particular gold is of high relevance in the manufacturing of electronic elements. Gold layers are frequently used as solderable and/or wire bondable surfaces. Typically, they are used as a final finish before soldering and wire bonding. Such layer stacks are preferred in a method of the present invention, i.e. they are either deposited onto the electrolessly deposited metallic palladium/palladium alloy (preferably metallic palladium) obtained after step (iii) or the electrolessly deposited metallic palladium/palladium alloy (preferably metallic palladium) obtained after step (iii) is already the very first layer of the respective layer stack.

Thus, a method of the present invention (as described above, preferably as described as being preferred) is preferred comprising after step (iii) the additional step (iv) electrolessly depositing one or more than one additional metal layer or metal alloy layer (preferably metal layer) onto the electrolessly deposited metallic palladium/palladium alloy (preferably metallic palladium) obtained after step (iii).

As mentioned above, palladium may act as a seed layer. The method of the present invention allows a selective deposition of the aforementioned layer stacks onto the non-activated surface of the gallium nitride semiconductor.

The present invention also refers to the use of an aqueous, acidic palladium plating bath (preferably a plating bath as defined for the method of the present invention), comprising (a) $Pd^{2+}$ ions,
(b) one or more than one reducing agent suitable to reduce $Pd^{2+}$ ions to metallic $Pd^0$,
(c) one or more than one compound selected from the group consisting of compounds of formulae (I) and (II)

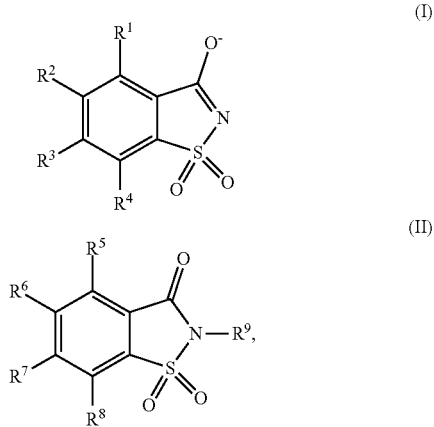

wherein $R^1$, $R^2$, $R^3$, $R^4$, $R^5$, $R^6$, $R^7$, and $R^8$ are independently H, alkyl, aryl, hetero aryl, $NH_2$, $SO_3H$, or OH, and $R^9$ is independently H, alkyl, aryl, or hetero aryl,
for directly and electrolessly depositing metallic palladium or a palladium alloy onto a non-activated surface of a doped or non-doped gallium nitride semiconductor, preferably in a method of the present invention (method as described above, preferably as described as being preferred). Features regarding the method of the present invention (e.g. meaning of alkyl, aryl etc.) likewise apply to the use of the plating bath.

In particular a use of the plating bath (use as described above) is preferred, wherein the plating bath has a temperature in the range of from 70° C. to 99° C., preferably in the range of from 70° C. to 95° C., more preferably in the range of from 75° C. to 95° C., most preferably in the range of from 79° C. to 91° C.

A use of the plating bath (use as described above, preferably as described as being preferred) is preferred, wherein the pH of the acidic palladium plating bath is in the range of from 4.0 to 6.5, preferably from 5.3 to 6.3.

The present invention also refers to the semiconductor obtained after step (iii) of the method of the present invention, i.e. to a palladium or palladium alloy coated, doped or non-doped gallium nitride semiconductor obtained through the method of the present invention (method as described above, preferably as described as being preferred), preferably obtained after step (iv) of the method of the present invention, respectively.

The present invention also refers to a palladium or palladium alloy coated, doped or non-doped gallium nitride semiconductor with an interface between the coated palladium or palladium alloy and the doped or non-doped gallium nitride semiconductor, wherein
  the palladium and palladium alloy is wet chemically deposited, preferably electrolessly deposited, and
  the interface does not contain tin ions, tin atoms, or tin containing compounds, preferably does not contain activation metal ions, activation metal atoms, or activation metal containing compounds.

For activation metals see text above regarding the method of the present invention.

The term "interface" describes the contact area formed by the surface of the semiconductor and the surface of the deposited palladium/palladium alloy, both surfaces facing each other. The "interface" serves as mediator between the surface of the semiconductor and the surface of the deposited palladium/palladium alloy such that both surfaces are in physical contact with each other (i.e. facing each other). In this way, the palladium/palladium alloy is directly (i.e. immediately) deposited on the surface of the semiconductor such that the palladium/palladium alloy is directly in contact with the surface of the gallium nitride semiconductor.

Preferably, the interface does not comprise ions and/or atoms of tin, aluminium, indium, zinc, iridium, ruthenium, silver and gold, more preferably the interface does not comprise ions and/or atoms of tin, aluminum, platinum, indium, zinc, iridium, ruthenium, nickel, silver, and gold.

A palladium or palladium alloy coated, doped or non-doped gallium nitride semiconductor exhibiting an interface as defined above can be identified by help of various methods such as Energy-dispersive X-ray spectroscopy (EDS), X-ray fluorescence (XRF), X-ray diffraction (XRD), Secondary ion mass spectroscopy (SIMS), and Transmission electron microscopy (TEM). In such a case, the skilled person is in the position to determine whether an activation metal such as tin or aluminium was utilized in order to activate the semiconductor surface.

Furthermore, wet chemically deposited palladium/palladium alloy can be distinguished from palladium/palladium alloys deposited by e.g. chemical vapour deposition (CVD) or physical deposition methods such as sputtering or physical vapour deposition (PVD). Typically, the crystal formation/structure of wet chemically deposited palladium/palladium alloys shows highly irregular grain sizes compared to comparatively regular, fine, amorphous or small grain sizes obtained with vapour deposition methods.

In addition, a palladium/palladium alloy deposit obtained according to the method of the present invention usually contains carbon in an amount of 0.5 to 1 weight percent, based on the total weight of the deposit. This carbon typically originates from organic compounds in the plating bath (e.g. from the reducing agents) and is typically not present in non-wet chemical deposition methods.

Thus, the skilled person is in the position to identify a palladium/palladium alloy deposited according to the method of the present invention on a respective gallium nitride semiconductor.

A palladium or palladium alloy coated, doped or non-doped gallium nitride semiconductor (as described above) is preferred, wherein the deposited palladium and palladium alloy has a total layer thickness in the range of from 10 nm to 1000 nm, more preferably 50 nm to 400 nm, most preferably 100 nm to 300 nm.

Throughout the text, the terms "deposited" and "coated" are used interchangeably.

The invention is further explained by the following non-limiting examples.

Examples

Step (i), Providing a Gallium Nitride Semiconductor:

In a first step four non-doped gallium nitride (GaN) semiconductors (mounted on Si wafers) with a non-activated surface were provided (base samples 1 to 4). The surfaces were not contacted with or did not comprise activation metal ions/atoms such as tin ions.

The gallium nitride semiconductor was patterned with a mask (cover/passivation layer for patterning) comprising silicon dioxide such that a non-doped gallium nitride semiconductor with a non-activated, patterned surface was provided.

Prior to Step (iii), Cleaning the Non-Activated Surface:

For each base sample, the non-activated surface was cleansed with a cleaning solution comprising an acid and a wetting agent (Xenolyte Cleaner D, product of Atotech) and having a temperature of approximately 40° C. Cleaning was carried out by immersing each sample into the cleaning solution for 5 minutes. Afterwards each sample was rinsed with deionized water. As a result, cleansed samples 1 to 4 were obtained.

Step (ii), Providing an Aqueous, Acidic Palladium Plating Bath:

Different aqueous, acidic palladium plating baths were prepared and provided, each having a pH-value of 5.8 and comprising palladium ions (concentration within 0.6 mmol/L to 20 mmol/L), sodium formate (concentration within 10 mmol/L to 70 mmol/L) as reducing agent for palladium ions, ethylenediamine (concentration within 15 mmol/L to 85 mmol/L) as complexing compound for palladium ions and saccharin sodium hydrate as a compound of (c). For more details regarding the total amount of saccharin sodium hydrate in each plating bath see Table 1 below.

Step (iii), Contacting the Semiconductor with the Plating Bath:

In a next step all four cleansed samples were contacted for 300 seconds with the respective aqueous, acidic palladium plating bath. For more details regarding plating bath conditions see Table 1 below.

For this purpose, each cleansed sample was immersed (dipped) into the respective plating bath, afterwards rinsed with deionized water for two minutes and subsequently dried with air pressure. As a result, treated samples 1 to 4 with a pure palladium deposit were obtained.

No further or additional treatment steps have been carried out.

Almost no palladium was deposited onto the mask during step (iii). Thus, palladium was selectively deposited onto gallium nitride and a palladium pattern was obtained on the surface of the semiconductor.

Results:

After step (iii), the presence of palladium and the layer thickness of deposited palladium on each semiconductor surface were investigated by optical microscopy and X-ray fluorescence (XRF, Fischer, Fischerscope® X-Ray XDV® 11). The results are shown in Table 1 below.

TABLE 1

| sample | (c)* | pH | T [° C.] | T [s]** | Pd [nm]# |
|---|---|---|---|---|---|
| 1 | 0 | 5.8 | 85 | 300 | 0 |
| 2 | 1 | 5.8 | 85 | 300 | 220 |
| 3 | 5 | 5.8 | 85 | 300 | 190 |
| 4 | 1 | 5.8 | 60 | 300 | 0 |

*concentration of (c) in mmol/L, based on the total volume of the aqueous, acidic palladium plating bath
**contact time in seconds of the semiconductor with the aqueous, acidic palladium plating bath
palladium layer thickness after step (iii) determined by optical microscopy and XRF measurements Treated samples 1 and 4 are comparative examples. Experiments for treated sample 1 were carried out in the absence of a compound of (c); experiments for treated sample 4 were carried out at a temperature below 70° C. Experiments for treated samples 2 and 3 were carried out according to the method of the present invention.

For treated samples 2 and 3 deposited palladium on the semiconductor surface was obtained. Since sodium formate was used as reducing agent for palladium ions no palladium alloy but rather pure metallic palladium was deposited. The layer thickness was in the very preferred range of 100 to 300 nm. Thus, the method of the present invention allows direct deposition of palladium onto a non-activated gallium nitride semiconductor surface.

On the contrary, on the surfaces of treated samples 1 and 4 no deposited palladium could be detected by microscopy or X-ray fluorescence.

The invention claimed is:

1. Method for directly depositing palladium onto a non-activated surface of a gallium nitride semiconductor, comprising in this order the steps:
   (i) providing a doped or non-doped gallium nitride semiconductor with a non-activated surface,
   (ii) providing an aqueous, acidic palladium plating bath, comprising
      (a) $Pd^{2+}$ ions,
      (b) one or more than one reducing agent suitable to reduce $Pd^{2+}$ ions to metallic $Pd^0$,
      (c) one or more than one compound selected from the group consisting of compounds of formulae (I) and (II)

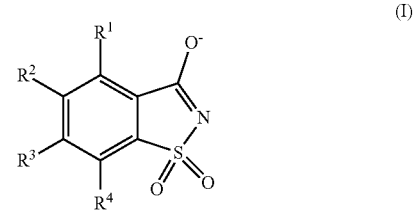

(I)

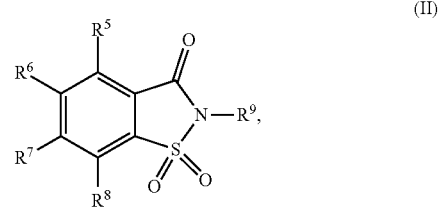

(II)

wherein $R^1$, $R^2$, $R^3$, $R^4$, $R^5$, $R^6$, $R^7$, and $R^8$ are independently H, alkyl, aryl, hetero aryl, $NH_2$, $SO_3H$, or OH, and $R^9$ is independently H, alkyl, aryl, or hetero aryl, (iii) contacting the semiconductor with the plating bath such that metallic palladium or a palladium alloy is electrolessly deposited onto the non-activated surface of the semiconductor, the plating bath temperature being in the range of from 70° C. to 99° C.

2. Method according to claim 1, wherein the surface of the semiconductor is not contacted with or does not comprise $Sn^{2+}$ ions prior to step (iii) or when step (iii) is carried out.

3. Method according to claim 1 comprising the additional step prior to step (iii)

cleaning the non-activated surface with a cleaning solution, the cleaning solution comprising one or more than one ingredient selected from the group consisting of acids, bases, oxidizing agents, halogen ions, and organic solvents.

4. Method according to claim 1, wherein the pH of the acidic palladium plating bath is in the range of from 4.0 to 6.5.

5. Method according to claim 1, wherein (c) is one or more than one compound of formula (I), wherein $R^1$, $R^2$, $R^3$, and $R^4$ is H.

6. Method according to claim 1, wherein the palladium plating bath additionally contains (d) one or more than one complexing compound selected from amines.

7. Method according to claim 1, wherein in step (iii) the semiconductor and the plating bath are in contact for 10 to 1200 seconds.

8. Method according to claim 1, wherein the plating bath temperature in step (iii) is in the range of from 70° C. to 95° C.

9. Method according to claim 1, wherein the deposited palladium and palladium alloy has a total layer thickness in the range of from 10 nm to 1000 nm.

10. Method according to claim 1, wherein the metallic palladium or palladium alloy is selectively deposited onto the non-activated surface such that a palladium pattern or palladium alloy pattern is obtained on the surface of the semiconductor.

11. Method according to claim 1 comprising after step (iii) the additional step (iv) depositing an additional metal layer or metal alloy layer onto the electrolessly deposited metallic palladium/palladium alloy obtained after step (iii).

12. Method according to claim 1, wherein the surface of the semiconductor is not contacted with or does not comprise activation metal ions or activation metal atoms prior to step (iii) or when step (iii) is carried out.

13. Method according to claim 1, wherein the pH of the acidic palladium plating bath is in the range of from 5.3 to 6.3.

14. Method according to claim 1, wherein the compound of formula (I) is a saccharin salt.

15. Method according to claim 1, wherein the non-activated surface of the semiconductor in step (i) by itself does not reduce $Pd^{2+}$ ions to metallic $Pd^0$ or mediates the reduction of $Pd^{2+}$ ions to metallic $Pd^0$.

16. Method according to claim 1 comprising after step (iii) the additional step (iv) depositing an additional metal layer or metal alloy layer onto the electrolessly deposited metallic palladium/palladium alloy obtained after step (iii) by electroless deposition.

* * * * *